US008879227B2

(12) United States Patent
Nakahara

(10) Patent No.: US 8,879,227 B2
(45) Date of Patent: *Nov. 4, 2014

(54) CURRENT LIMITING CIRCUIT

(71) Applicant: Renesas Electronics Corporation, Kanagawa (JP)

(72) Inventor: Akihiro Nakahara, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/923,017

(22) Filed: Jun. 20, 2013

(65) Prior Publication Data

US 2013/0278236 A1    Oct. 24, 2013

Related U.S. Application Data

(63) Continuation of application No. 13/010,428, filed on Jan. 20, 2011, now Pat. No. 8,493,702.

(30) Foreign Application Priority Data

Feb. 10, 2010    (JP) .................................. 2010-028004

(51) Int. Cl.
*H02H 9/02* (2006.01)
*G05F 1/10* (2006.01)
*H03K 17/082* (2006.01)

(52) U.S. Cl.
CPC .............. *G05F 1/10* (2013.01); *H03K 17/0822* (2013.01)
USPC ........................................ 361/93.9; 361/93.7

(58) Field of Classification Search
USPC ............................... 361/93.1, 93.7–93.9, 93.8
See application file for complete search history.

(56) References Cited

U.S. PATENT DOCUMENTS

| | | | |
|---|---|---|---|
| 5,501,517 | A | 3/1996 | Kiuchi |
| 5,579,193 | A | 11/1996 | Schmidt et al. |
| 5,642,252 | A | 6/1997 | Sakamoto et al. |
| 5,903,422 | A | 5/1999 | Hosokawa |
| 7,626,792 | B2 | 12/2009 | Mitsuda |
| 8,089,742 | B2 | 1/2012 | Ohshima |
| 2002/0118502 | A1 | 8/2002 | Yabe et al. |
| 2008/0232017 | A1 | 9/2008 | Nakajima |

FOREIGN PATENT DOCUMENTS

| | | |
|---|---|---|
| CN | 1455936 A | 11/2003 |
| CN | 101118188 A | 2/2008 |
| JP | 9-64652 A | 3/1997 |
| JP | 10-256541 A | 9/1998 |
| JP | 2005-039573 A | 2/2005 |
| JP | 2008-236528 A | 10/2008 |
| WO | 0189053 A1 | 11/2001 |

OTHER PUBLICATIONS

Communication, dated Jul. 23, 2013, issued by the Japanese Patent Office in counterpart Japanese Patent Application No. 2010-028004.
Search Report dated May 11, 2011 from the European Patent Office in counterpart European application No. 11150094.
Chinese Office Action issued Mar. 5, 2014 in corresponding Chinese Patent Application No. 201110037002.4.

*Primary Examiner* — Jared Fureman
*Assistant Examiner* — Christopher Clark
(74) *Attorney, Agent, or Firm* — Sughrue Mion, PLLC

(57) ABSTRACT

An exemplary aspect of the present invention is a current limiting circuit including: an output transistor that controls a current flowing to a load from a power supply; a current sense transistor through which a current dependent on a current flowing through the output transistor flows; a sense resistor connected in series with the current sense transistor; a potential difference detection unit that detects a potential difference generated between both ends of the sense resistor; a constant current generation unit that supplies a constant current to the potential difference detection unit; and a control unit that controls a conduction state of the output transistor based on a control voltage generated based on the potential difference and the constant current, in which the sense resistor is disposed so as to surround the potential difference detection unit.

11 Claims, 10 Drawing Sheets

PRIOR ART

CURRENT LIMITING CIRCUIT

INCORPORATION BY REFERENCE

This is a Continuation application of application Ser. No. 13/010,428 filed Jan. 20, 2011, which is based upon and claims the benefit of priority from Japanese patent application No. 2010-028004, filed on Feb. 10, 2010, the disclosures of which are incorporated herein in its entirety by reference.

BACKGROUND

1. Field of the Invention

The present invention relates to a current limiting circuit, and more particularly, to protection against overcurrent in an output transistor.

2. Description of Related Art

A power supply semiconductor is known as a circuit that controls supply of power to a load from a power supply. In the power supply semiconductor, an N-channel MOS transistor is used as an output transistor for a high-side switch, for example.

The power supply semiconductor for use in an LSI (Large Scale Integration) for automotive electrical equipment needs to be protected so as not to be damaged, even if an abnormality such as short-circuiting of a harness to ground occurs.

For example, if the covering of a harness for connecting a load is peeled off and the harness comes into contact with the body (ground) of a vehicle, the load is short-circuited. As a result, excessive power may be applied to the power supply semiconductor. In order to prevent the power supply semiconductor from being damaged in such a case, the power supply semiconductor is typically mounted with an overcurrent protection circuit. As an example of the overcurrent protection circuit, a current limiting circuit is known.

The current limiting circuit performs a feedback control to prevent an overcurrent from flowing through the power supply semiconductor. In other words, the current limiting circuit controls the gate voltage of the output transistor so as to prevent an overcurrent from flowing between the source and drain of the output transistor.

A vehicle-mounted semiconductor device is used over a fairly wide temperature range in view of the environment in which the device finds use. Accordingly, it is necessary for the current limiting circuit to accurately limit the overcurrent flowing through the output transistor without being affected by a temperature change.

FIG. 10 shows a current limiting circuit disclosed in Japanese Unexamined Patent Application Publication No. 2008-236528. The circuit shown in FIG. 10 includes an output transistor 201, a wire 217, a booster circuit 215, diode groups 221 and 222, an amplifier 203, a transistor 202, and current sources 204 and 205. The diode groups 221 and 222, the amplifier 203, the transistor 202, and the current sources 204 and 205 constitute a control circuit 220. The output transistor 201 has a switch function for controlling a current flowing from a power supply 211 to a load 212. The control circuit 220 detects a potential difference generated between both ends (nodes A and B) of the wire 217, and limits a current flowing through the output transistor 201 when the potential difference is greater than a predetermined value.

The technique disclosed in Japanese Unexamined Patent Application Publication No. 2008-236528 has a feature that an overcurrent flowing through the output transistor 201 is limited with high accuracy even when the resistance component of the wire 217 varies due to a temperature change, by utilizing the fact that a temperature coefficient at a potential difference between the two diode groups 221 and 222 and a temperature coefficient of an electrical resistivity of the wire 217 through which a load current flows are equal to each other.

Further, Japanese Unexamined Patent Application Publication No. 2005-39573 and U.S. Pat. No. 7,626,792 B2 disclose an overcurrent detecting circuit as a related art (see FIG. 4 of Japanese Unexamined Patent Application Publication No. 2005-39573 and FIG. 6 of U.S. Pat. No. 7,626,792 B2). The overcurrent detecting circuit disclosed in Japanese Unexamined Patent Application Publication No. 2005-39573 includes an output transistor Q1, a sense transistor Q2 provided in parallel with the output transistor Q1, a detection resistor RS connected in series with the sense transistor Q2, and comparators (transistors 9, 10, Q3, and Q4) that compare a potential generated by the detection resistor RS with a threshold voltage and output an overcurrent detection signal.

Furthermore, U.S. Pat. No. 5,579,193 discloses an overcurrent protection circuit as a related art (see FIG. 2 of U.S. Pat. No. 5,579,193). The overcurrent protection circuit disclosed in U.S. Pat. No. 5,579,193 includes an output transistor 110, a sense transistor 112 provided in parallel with the output transistor, a sense resistor R1 connected in series with the sense transistor 112, a comparator 120 that compares a potential generated by the sense resistor R1 and a reference value, and a limiting circuit 20 that controls a conduction state of the output transistor based on a comparison result of the comparator 120. It is also disclosed that the sense resistor R1 may be a metal resistor.

SUMMARY

The present inventor has found problems as described below. Japanese Unexamined Patent Application Publication No. 2008-236528 fails to disclose an arrangement relationship between the wire 217 and the diode groups 221 and 222. In other words, the arrangement in which the temperature of the wire 217 is made close to the temperature of the diode groups 221 and 222 is not taken into consideration.

Accordingly, as shown in FIG. 11, when the wire 217 and the diode groups 221 and 222 are arranged to be spaced apart from each other, the temperature of the wire 217 and the temperature of the diode groups 221 and 222 may be different from each other. Thus, Japanese Unexamined Patent Application Publication No. 2008-236528 has a problem in that when the resistance component of the wire 217 varies due to a temperature change, a current flowing through the output transistor 201 cannot be accurately controlled. This causes another problem in that, in Japanese Unexamined Patent Application Publication No. 2008-236528, a current value obtained during the current limitation is modulated by the effect of self-heating of the output transistor 201 as shown in FIG. 12.

Japanese Unexamined Patent Application Publication No. 2005-39573 also fails to disclose an arrangement relationship between the detection resistor RS and the transistors Q3 and Q4. In other words, in Japanese Unexamined Patent Application Publication No. 2005-39573 and U.S. Pat. No. 7,626,792 B2, the arrangement in which the temperature of the detection resistor RS is made close to the temperature of the transistors Q3 and Q4 is not taken into consideration. Thus, Japanese Unexamined Patent Application Publication No. 2005-39573 has a problem in that when the resistance component of the detection resistor RS varies due to a temperature change, a current flowing through the output transistor Q1 cannot be accurately detected. The same holds true for U.S. Pat. No. 7,626,792 B2.

As in the case of Japanese Unexamined Patent Application Publication Nos. 2008-236528 and 2005-39573 and U.S. Pat. No. 7,626,792 B2, U.S. Pat. No. 5,579,193 also fails to disclose an arrangement relationship between the sense resistor R1, the comparator 120, and the like. In other words, in U.S. Pat. No. 5,579,193, the arrangement in which the temperature of the sense resistor R1 is made close to the temperature of the comparator 120 and the like is not taken into consideration. Thus, U.S. Pat. No. 5,579,193 has a problem in that when the resistance component of the sense resistor RS varies due to a temperature change, a current flowing through the output transistor 110 cannot be accurately controlled.

A first exemplary aspect of the present invention is a current limiting circuit including: an output transistor that controls a current flowing to a load from a power supply; a current sense transistor through which a current dependent on a current flowing through the output transistor flows; a sense resistor connected in series with the current sense transistor; a potential difference detection unit that detects a potential difference generated between both ends of the sense resistor based on a current flowing through the sense resistor and a resistance component of the sense resistor; a constant current generation unit that supplies a constant current to the potential difference detection unit; and a control unit that controls a conduction state of the output transistor based on a control voltage generated based on the potential difference and the constant current, in which the sense resistor is disposed so as to surround the potential difference detection unit.

The circuit configuration as described above enables accurate control of the current flowing through the output transistor even when a temperature change occurs.

According to an exemplary aspect of the present invention, it is possible to provide a current limiting circuit capable of accurately controlling a current flowing through an output transistor even when a temperature change occurs.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the accompanying drawings. For clarity of the explanation, a redundant description will be omitted as appropriate.

First Exemplary Embodiment

Figure 1:
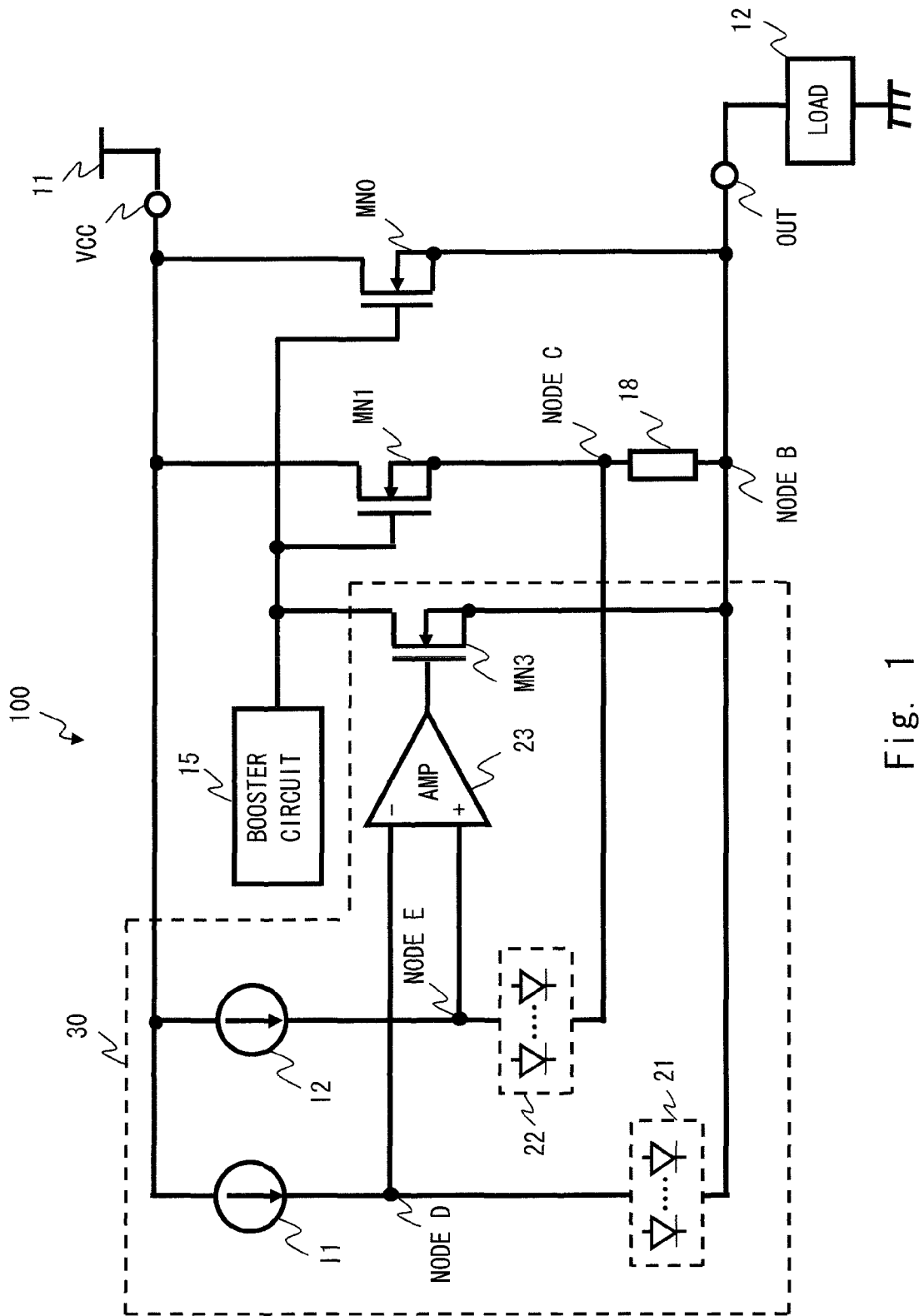
FIG. 1 is a diagram showing a current limiting circuit according to a first exemplary embodiment of the present invention.

FIG. 1 shows a current limiting circuit 100 according to an exemplary embodiment of the present invention. The current limiting circuit 100 shown in FIG. 1 includes an output transistor (hereinafter, referred to simply as "transistor") MN0, a transistor (current sense transistor) MN1, a booster circuit 15, a sense resistor 18, and a determination circuit 30. The first exemplary embodiment exemplifies a case where the transistor MN0 and the transistor MN1 are N-channel MOS transistors.

The sense resistor 18 is formed of a metal having a high heat conductivity. Specifically, the sense resistor 18 is formed of aluminum, copper, or an alloy containing at least one of these elements as a main component.

First, an exemplary configuration of the circuit shown in FIG. 1 will be described. The transistor MN0 is provided between a high-potential-side power supply terminal VCC and an output terminal OUT. The high-potential-side power supply terminal VCC is supplied with a high-potential-side power supply 11. A load 12 is provided between the output terminal OUT and a low-potential-side power supply terminal GND.

The transistor MN1 is provided between the high-potential-side power supply terminal VCC and the output terminal OUT and is connected in parallel with the transistor MN0. An output terminal of the booster circuit 15 is connected to the gates of the transistors MN0 and MN1. The sense resistor 18 is connected in series between the transistor MN1 and the output terminal OUT. Specifically, the source of the transistor MN1 is connected to one end (node C) of the sense resistor 18. The other end (node B) of the sense resistor 18 is connected to the output terminal OUT.

The determination circuit 30 includes a diode group (first diode group) 21, a diode group (second diode group) 22, a current source (first current source) I1, a current source (second current source) I2, an amplifier 23, and a transistor (control transistor) MN3. The diode groups 21 and 22 constitute a potential difference detection unit. The current sources I1 and I2 constitute a constant current generation unit. The amplifier 23 and the transistor MN3 constitute a control unit. The first exemplary embodiment exemplifies a case where the transistor MN3 is an N-channel MOS transistor.

The diode group 21 is provided between the high-potential-side power supply terminal VCC and the other end (node B) of the sense resistor 18. The current source I1 is connected between the diode group 21 and the high-potential-side power supply terminal VCC. Specifically, the high-potential-side power supply terminal VCC is connected to an input terminal of the current source I1. An output terminal of the current source I1 is connected to one end (anode side) of the diode group 21 through a node D. The other end (cathode side) of the diode group 21 is connected to the other end (node B) of the sense resistor 18.

The diode group 22 is provided between the high-potential-side power supply terminal VCC and one end (node C) of the sense resistor 18. The current source 12 is connected between the diode group 22 and the high-potential-side power supply terminal VCC. Specifically, the high-potential-side power supply terminal VCC is connected to an input terminal of the current source 12. An output terminal of the current source 12 is connected to one end (anode side) of the diode group 22 through a node E. The other end (cathode side) of the diode group 22 is connected to one end (node C) of the sense resistor 18.

The diode group 21 has X-number (where X is an integer equal to or greater than 1) of parallel-connected diodes constituting one set in which anodes are connected in common and cathodes are connected in common, L-number (where L is an integer equal to or greater than 1) of the diode sets being connected serially in the forward direction. The diode group 22 has Y-number (where Y is an integer equal to or greater than 1) of parallel-connected diodes constituting one set in which anodes are connected in common and cathodes are connected in common, L-number of the diode sets being connected serially in the forward direction.

Assuming that a current ratio between the current source I1 and the current source 12 is M:N (where M and N are integers), the determination circuit 30 is preferably configured so as to satisfy $(M \cdot Y)/(N \cdot X) > 1$. The reason for this will be described later.

The amplifier 23 has an inverting input terminal connected to the node D, a non-inverting input terminal connected to the node E, and an output terminal connected to the gate of the transistor MN3. The transistor MN3 is provided between the gate and the source of the transistor MN0.

Next, operation of the circuit shown in FIG. 1 will be described. The transistor MN0 has a switching function for controlling a current flowing to the load 12 from the high-potential-side power supply 11. A current dependent on a current flowing through the source and drain of the transistor MN0 flows through the source and drain of the transistor MN1. The booster circuit 15 controls the current flowing through the transistors MN0 and MN1. Specifically, in the case of controlling the transistors MN0 and MN1 to be turned off, the booster circuit 15 applies a control signal of low voltage level to the gates of the transistors. Meanwhile, in the case of controlling the transistors MN0 and MN1 to be turned on, the booster circuit 15 applies a control signal of high voltage level to the gates of the transistors.

The current flowing through the transistor MN1 flows toward the output terminal OUT through the sense resistor 18. At this time, a potential difference is generated between both ends (nodes B and C) of the sense resistor 18 based on a current value of a current flowing through the sense resistor 18 and a resistance value of the sense resistor 18.

The determination circuit 30 has a function of detecting the potential difference generated between the both ends of the sense resistor 18, and limiting the current flowing through the transistor MN0 when the potential difference is greater than a predetermined value. For instance, when a current (load current) flowing through the load 12 falls within a normal range, the potential difference between the both ends (nodes B and C) of the sense resistor 18 is small. At this time, the determination circuit 30 is configured so that the potential at the node E becomes equal to or lower than the potential at the node D.

In other words, the potential at the non-inverting input terminal of the amplifier 23 is lower than the potential at the inverting input terminal of the amplifier 23. Accordingly, the voltage applied to the gate of the transistor MN3 by the amplifier 23 decreases, thereby turning off the transistor MN3. Therefore, electric charges accumulated in the gate of the transistor MN0 are not discharged through the transistor MN3. That is, the transistor MN0 operates without being affected by the transistor MN3.

Meanwhile, when the load current exceeds the normal range, i.e., when the current flowing through the transistor MN0 is greater than a reference value (output current limiting value), the potential difference between the both ends of the sense resistor 18 is greater than the predetermined value. At this time, the determination circuit 30 is configured so that the potential at the node E becomes higher than the potential at the node D. In other words, the potential at the non-inverting input terminal of the amplifier 23 is higher than the potential at the inverting input terminal of the amplifier 23. Accordingly, the potential applied to the gate of the transistor MN3 by the amplifier 23 increases. The resistance component between the source and the drain of the transistor MN3 decreases along with an increase of the gate-source voltage. Therefore, the gate voltage of the transistor MN0 decreases. That is, the current flowing through the transistor MN0 is limited by the effect of the transistor MN3.

In such a circuit configuration, the resistance component of the sense resistor 18 may vary due to a temperature change. The current limiting circuit according to the first exemplary embodiment can accurately control the current flowing through the output transistor MN0 even when the resistance component of the sense resistor 18 varies due to a temperature change.

Specifically, the current limiting circuit 100 according to the first exemplary embodiment can suppress the variation in the output current limiting value when the temperature of the diode groups 21 and 22 and the temperature of the sense resistor 18 are approximately the same. It has turned out that a temperature coefficient at a potential difference between two diode groups through which a constant current is passed is approximately the same as a temperature coefficient at an electrical resistivity of a metal. Accordingly, the current limiting circuit 100 according to the first exemplary embodiment detects a potential difference of the metal sense resistor 18 by using the determination circuit 30 including the two diode groups 21 and 22, to thereby cancel out the effect of the temperature change and suppress the variation in the output current limiting value.

When a load current Ia agrees with the output current limiting value, the following equation holds:

$$L \cdot (k/q) \cdot (T+273) \cdot \ln\{(M \cdot I)/(X \cdot Is)\} - L \cdot (k/q) \cdot (T+273) \cdot \ln\{(N \cdot I)/(Y \cdot Is)\} = Ia \cdot R \cdot \{1 + tc \cdot (T-25)\} \quad (1)$$

where k represents the Boltzmann's constant, q represents the kinetic energy of electrons, T represents the temperature in degrees Celsius, Is represents the diode saturation current, and tc represents the temperature coefficient of the metal constituting the sense resistor 18.

If the load current Ia is found from Equation (1), it is represented by the following equation:

$$Ia = [L \cdot (k/q) \cdot (T+273) \cdot \ln\{(M \cdot Y)/(N \cdot X)\}]/[R \cdot \{1 + tc \cdot (T-25)\}] \quad (2)$$

Since Ia>0 must hold in Equation (2), it is necessary that $(M \cdot Y)/(N \cdot X) > 1$ be satisfied. If each diode group and each current source are configured so as to satisfy this condition, the variation in the output current limiting value can be suppressed even when the resistance component of the sense resistor 18 varies due to a temperature change. That is, the current limiting circuit according to the first exemplary embodiment can accurately control the current flowing through the transistor MN0.

Figure 2:
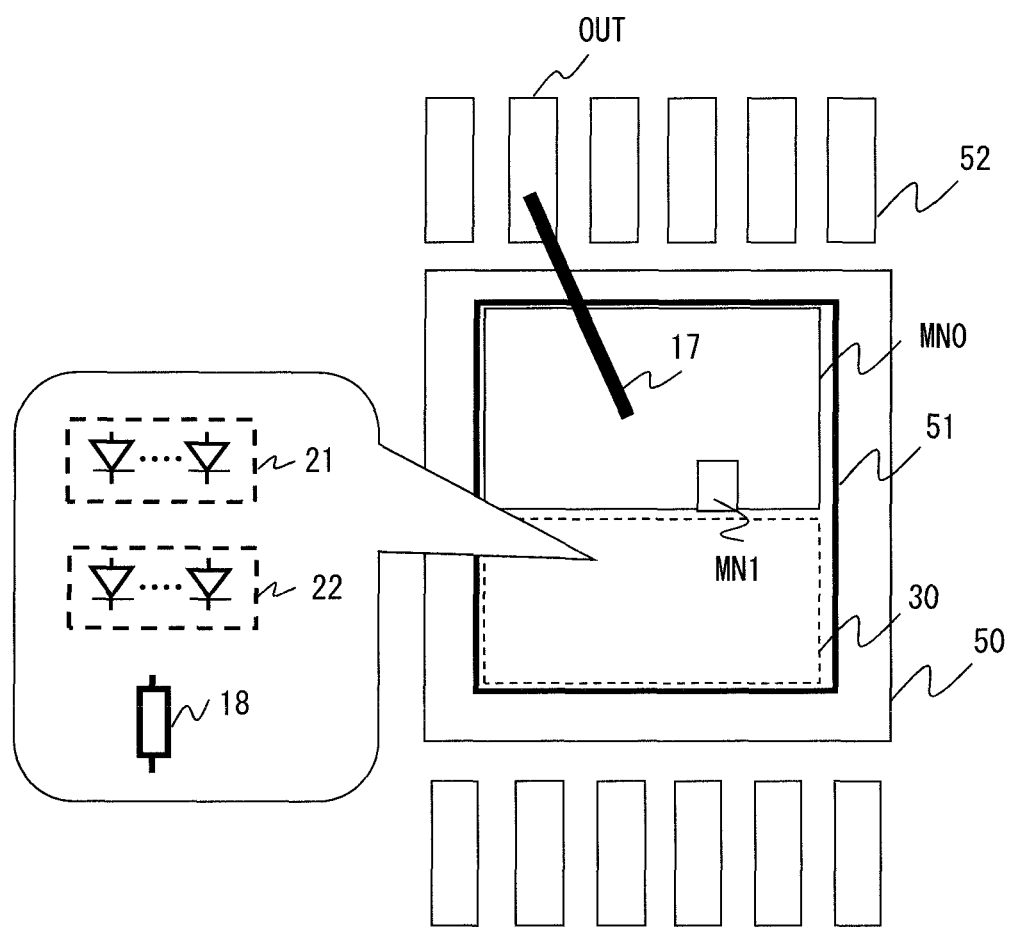
FIG. 2 is a block diagram showing the current limiting circuit according to the first exemplary embodiment of the present invention.

FIG. 2 is a layout diagram of the current limiting circuit 100 according to the first exemplary embodiment. As shown in FIG. 2, a semiconductor chip 51 is disposed on a die pad 50 at the center of the drawing sheet. In the semiconductor chip 51, the transistor MN0 is disposed in an upper part of FIG. 2, and the determination circuit 30 is disposed in a lower part of FIG. 2. Further, six leads 52 are disposed in parallel along each of the upper side and the lower side of the semiconductor chip 51. In the example shown in FIG. 2, among the six leads 52 disposed on the upper side of the semiconductor chip 51, the second one from the left corresponds to the output terminal OUT. The output terminal OUT and the transistor MN0 are connected through a wire 17.

As shown in FIG. 2, in the current limiting circuit 100 according to the first exemplary embodiment, the transistor MN1, the sense resistor 18, and the diode groups 21 and 22 are disposed in the same region. In other words, in the current limiting circuit 100 according to the first exemplary embodiment, the transistor MN1, the sense resistor 18, and the diode groups 21 and 22 are disposed to be close to each other. In the current limiting circuit 100 according to the first exemplary embodiment, a signal path for the transistor MN0 is different from a signal path for the transistor MN1 and the sense resistor 18. Accordingly, the degree of freedom of layout of the sense resistor 18 increases, with the result that the sense resistor 18 is easily disposed near the diode groups 21 and 22.

The both ends (nodes B and C) of the sense resistor 18 are respectively connected to the cathodes of the diode groups 21 and 22. Thus, when a metal resistor (e.g., aluminum resistor) having a high heat conductivity is used as the sense resistor 18, the temperature of the sense resistor 18 can be conducted to the diode groups 21 and 22. As a result, the temperature of the sense resistor 18 can be made approximately equal to the temperature of the diode groups 21 and 22. The both ends of the sense resistor 18 are also connected to the sources of the transistors MN0 and MN1. Accordingly, the temperature of the sense resistor 18 becomes equal to the temperature of the transistor MN0 serving as a heating element. In short, since the temperatures of the sense resistor 18, the diode groups 21 and 22, and the transistors MN0 and MN1 are approximately the same, the current limiting circuit 100 according to the first exemplary embodiment can accurately control the current flowing through the transistor MN0.

Figure 3:
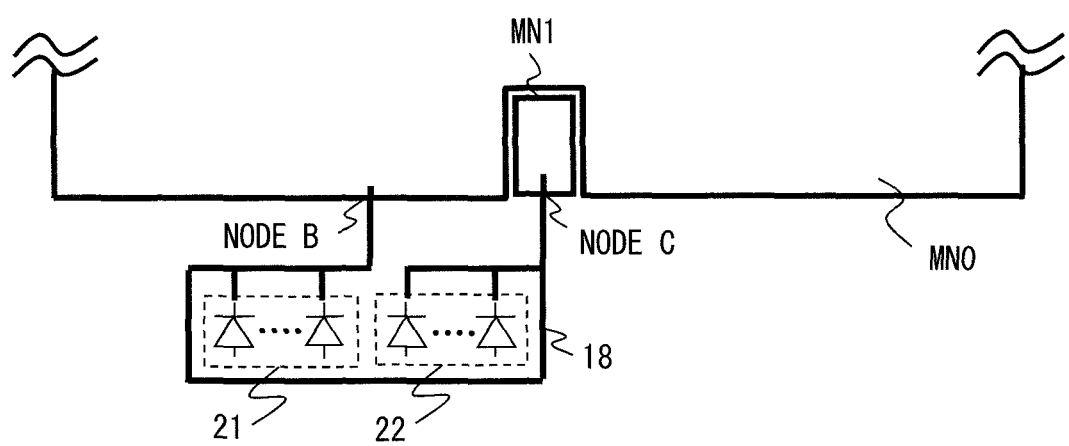
FIG. 3 is a layout diagram showing the current limiting circuit according to the first exemplary embodiment of the present invention.

FIG. 3 is a diagram showing an exemplary layout of the current limiting circuit 100 according to the first exemplary embodiment. As shown in FIG. 3, the transistor MN0 is disposed at the upper side of FIG. 3. On the lower side of the transistor MN0, the transistor MN1 is disposed in a recess that opens upwardly. The diode groups 21 and 22 are disposed in the region of the determination circuit 30 in the lower part of FIG. 3. The sense resistor 18 that connects the transistor MN0 and the transistor MN1 is disposed in the region of the determination circuit 30 so as to surround the diode groups 21 and 22. Thus, the sense resistor 18 radiates heat toward the vicinity of the diode groups 21 and 22. As a result, the temperature of the diode groups 21 and 22 can be made much closer to the temperature of the sense resistor 18.

In this manner, in the current limiting circuit 100 according to the first exemplary embodiment, since the sense resistor 18 is disposed near the diode groups 21 and 22, the temperature of the diode groups 21 and 22 can be made approximately equal to the temperature of the sense resistor 18. In particular, in the current limiting circuit 100 according to the first exemplary embodiment, since the sense resistor 18 is disposed so as to surround the diode groups 21 and 22, the temperature of the diode groups 21 and 22 can be made much closer to the temperature of the sense resistor 18. Consequently, the current limiting circuit 100 according to the first exemplary embodiment can accurately control the current flowing through the transistor MN0 even when the resistance component of the sense resistor 18 varies due to a temperature change.

Second Exemplary Embodiment

In the current limiting circuit 100 of the first exemplary embodiment, the diode groups 21 and 22 disposed between the high-potential-side power supply terminal VCC and the output terminal OUT contribute to improvement of the temperature characteristic. However, when the diodes are connected in cascade, it is difficult for the current limiting circuit 100 of the first exemplary embodiment to operate in the state where the voltage level of the high-potential-side power supply 11 is low. In view of this, a current limiting circuit 101 of a second exemplary embodiment of the present invention employs a circuit configuration in which the diode groups 21 and 22 are not used.

Figure 4:
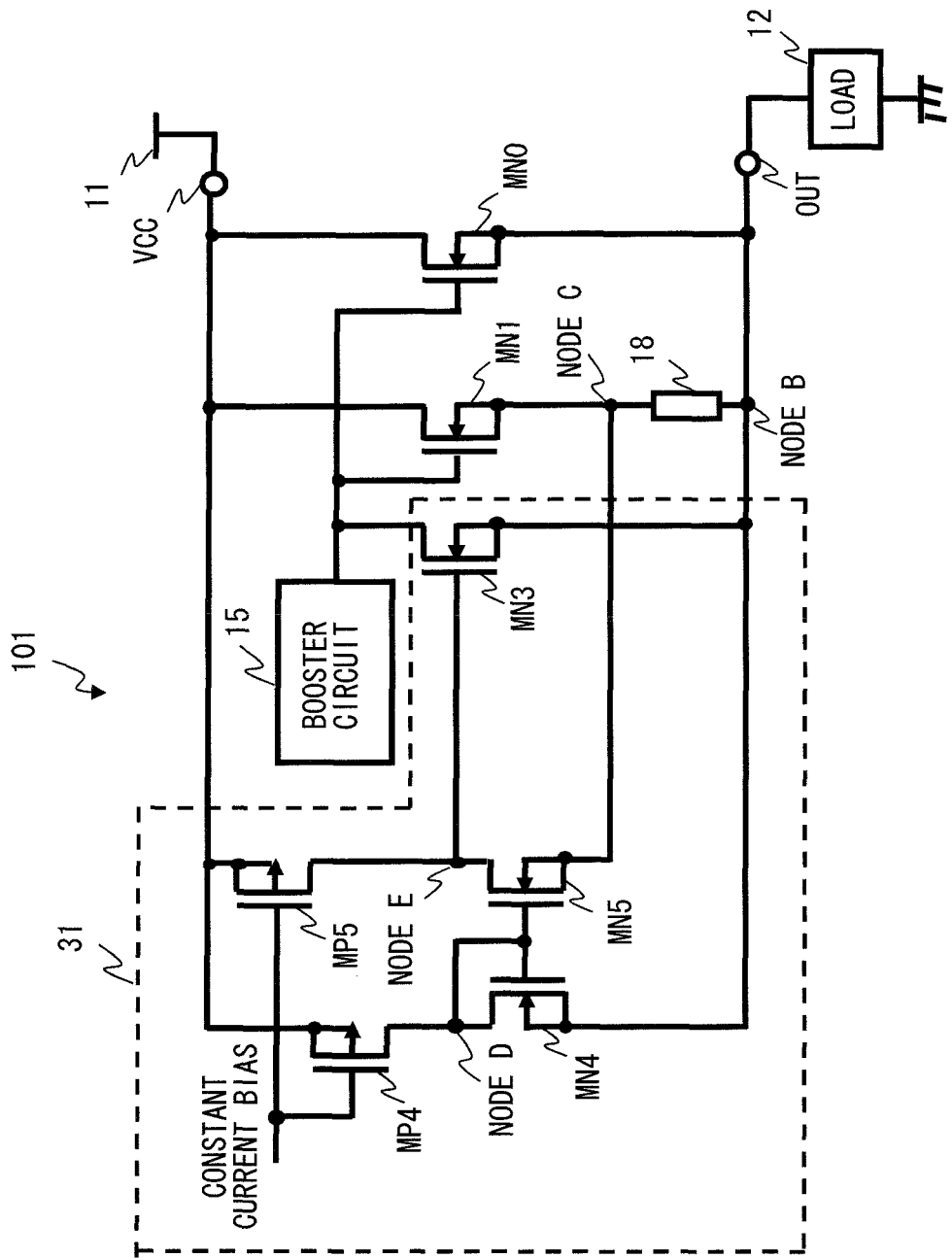
FIG. 4 is a diagram showing a current limiting circuit according to a second exemplary embodiment of the present invention.

FIG. 4 is a circuit diagram showing the current limiting circuit 101 according to the second exemplary embodiment. The circuit shown in FIG. 4 includes a transistor (first potential difference detecting transistor) MN4, a transistor (second potential difference detecting transistor) MN5, a transistor (first constant current transistor) MP4, and a transistor (second constant current transistor) MP5, in place of the diode groups 21 and 22, the current sources I1 and I2, and the amplifier 23. The transistors MP4 and MP5 constitute a constant current generation unit. The transistors MN4 and MN5 constitute a potential difference detection unit. The transistor MN3 constitutes a control unit. The constant current generation unit, the potential difference detection unit, and the control unit constitute a determination circuit 31. The second exemplary embodiment exemplifies a case where the transistors MN4 and MN5 are N-channel MOS transistors. Further, the second exemplary embodiment exemplifies a case where the transistors MP4 and MP5 are P-channel MOS transistors.

An exemplary circuit configuration of the circuit shown in FIG. 4 will be described. The transistors MP4 and MP5 constitute a current mirror. The sources of the transistors MP4 and MP5 are each connected to the high-potential-side power supply terminal VCC. A constant current bias is applied to the gates of the transistors MP4 and MP5. The drain of the transistor MP4 is connected to the drain and gate of the transistor MN4 and the gate of the transistor MN5 through the node D. The source of the transistor MN4 is connected to the other end (node B) of the sense resistor 18. The drain of the transistor MP5 is connected to the drain of the transistor MN5 and the gate of the transistor MN3 through the node E. The source of the transistor MN5 is connected to one end (node C) of the sense resistor 18. The transistor MN3 is connected between the gate and the source of the transistor MN0. The other circuit configuration is similar to that of FIG. 1, so the description thereof is omitted.

Next, operation of the circuit shown in FIG. 4 will be described. In the determination circuit 31, current detection is carried out based on a voltage difference (VGS4−VGS5) between a gate-source voltage (referred to as "VGS4") of the transistor MN4 and a gate-source voltage (referred to as "VGS5") of the transistor MN5.

As in the case of FIG. 1, when a load current falls within the normal range, a potential difference between the both ends (nodes B and C) of the sense resistor 18 is small. At this time, the potential at the node E decreases. Thus, the transistor MN3 turns off. Accordingly, electric charges accumulated in the gate of the transistor MN0 are not discharged through the transistor MN3. That is, the transistor MN0 operates without being affected by the transistor MN3.

Meanwhile, when the load current exceeds the normal range, i.e., when the current flowing through the transistor MN0 is greater than the output current limiting value, the potential different between the both ends of the sense resistor 18 is greater than the predetermined value. At this time, the potential at the node E increases. Thus, the resistance component between the source and the drain of the transistor MN3 decreases along with an increase of the gate-source voltage. Accordingly, the gate voltage of the transistor MN0 decreases. That is, the current flowing through the transistor MN0 is limited by the effect of the transistor MN3.

When the temperature of the gate voltage differences between the transistor MN4 and the transistor MN5 (VGS5-VGS4) and the temperature of the sense resistor 18 are approximately the same, the current limiting circuit 101 shown in FIG. 4 can suppress the variation in the output current limiting value.

In the current limiting circuit 101 according to the second exemplary embodiment, the transistor MN1, the sense resistor 18, and the transistors MN4 and MN5 are disposed in the same region. In other words, in the current limiting circuit 101 according to the second exemplary embodiment, the transistor MN1, the sense resistor 18, and the transistors MN4 and MN5 are disposed to be close to each other. In the current limiting circuit 101 according to the second exemplary embodiment, a signal path for the transistor MN0 is different from a signal path for the transistor MN1 and the sense resistor 18. Accordingly, the degree of freedom of layout of the sense resistor 18 increases, with the result that the sense resistor 18 is easily disposed near the transistors MN4 and MN5.

Further, the both ends (nodes B and C) of the sense resistor 18 are respectively connected to the sources of the transistors MN4 and MN5. Thus, when a metal resistor (e.g., aluminum resistor) having a high heat conductivity is used as the sense resistor 18, the temperature of the sense resistor 18 can be conducted to the transistors MN4 and MN5. As a result, the temperature of the sense resistor 18 can be made approximately equal to the temperature of the transistors MN4 and MN5. The both ends of the sense resistor 18 are also connected to the sources of the transistors MN0 and MN1. Accordingly, the temperature of the sense resistor 18 becomes equal to the temperature of the transistor MN0 serving as a heating element. In short, since the temperatures of the sense resistor 18, the transistors MN4 and MN5, and the transistors MN0 and MN1 are approximately the same, the current limiting circuit 101 according to the second exemplary embodiment can accurately control the current flowing through the transistor MN0.

Figure 5:
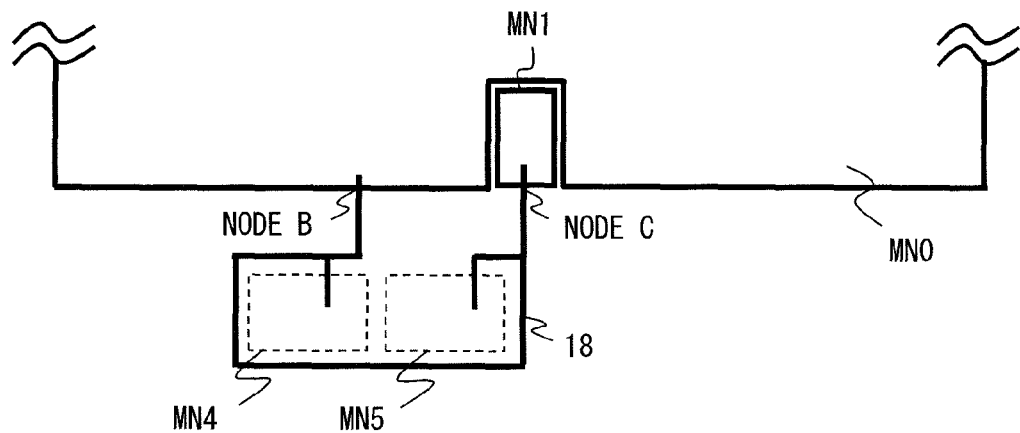
FIG. 5 is a layout diagram showing the current limiting circuit according to the second exemplary embodiment of the present invention.

FIG. 5 is a diagram showing an exemplary layout of the current limiting circuit 101 according to the second exemplary embodiment. As shown in FIG. 5, the transistor MN0 is disposed in an upper part of FIG. 5. On the lower side of the transistor MN0, the transistor MN1 is disposed in a recess that opens upwardly. The transistors MN4 and MN5 are disposed in the region of the determination circuit 31 in a lower part of FIG. 5. Further, the sense resistor 18 that connects the transistor MN0 and the transistor MN1 is disposed in the region of the determination circuit 31 so as to surround the transistors MN4 and MN5. Thus, the sense resistor 18 radiates heat toward the vicinity of the transistors MN4 and MN5. As a result, the temperature of the transistors MN4 and MN5 can be made much closer to the temperature of the sense resistor 18.

In this manner, in the current limiting circuit 101 according to the second exemplary embodiment, since the sense resistor 18 is disposed near the transistors MN4 and MN5, the temperature of the transistors MN4 and MN5 can be made approximately equal to the temperature of the sense resistor 18. In particular, in the current limiting circuit 101 according to the second exemplary embodiment, since the sense resistor 18 is disposed so as to surround the transistors MN4 and MN5, the temperature of the transistors MN4 and MN5 can be made much closer to the temperature of the sense resistor 18. Consequently, the current limiting circuit 101 according to the second exemplary embodiment can accurately control the current flowing through the transistor MN0 even when the resistance component of the sense resistor 18 varies due to a temperature change.

Figure 6:
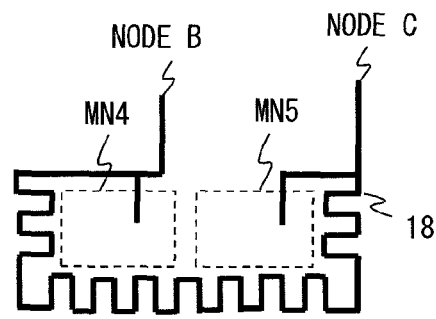
FIG. 6 is a layout diagram showing a sense resistor used for the current limiting circuit according to the second exemplary embodiment of the present invention.
Figure 7:
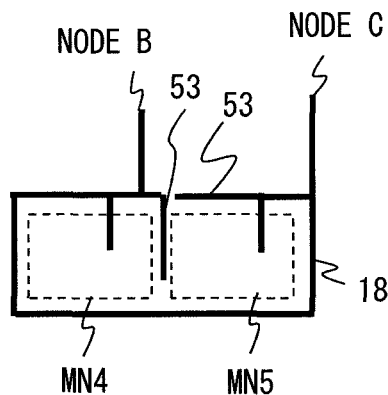
FIG. 7 is a layout diagram showing the sense resistor used for the current limiting circuit according to the second exemplary embodiment of the present invention.

FIGS. 6 and 7 are diagrams each showing an exemplary layout of the sense resistor 18. As shown in FIG. 6, the sense resistor 18 is disposed in a bending layout so as to surround the transistors MN4 and MN5 in the region of the determination circuit 31. In other words, the sense resistor 18 is formed in a zig-zag manner in the region of the determination circuit 31 so that a convex portion and a concave portion with respect to the transistors MN4 and MN5 are continuously formed. Note that the sense resistor 18 is not necessarily bent at a right angle, but may be curved. Additionally, as shown in FIG. 7, the sense resistor 18 is integrally formed with a dummy heat radiation fin 53 and is disposed so as to surround the transistors MN4 and MN5. In the example shown in FIG. 7, the heat radiation fin 53 has one end connected to a part of the sense resistor 18, and the other end unconnected. The heat radiation fin 53 is disposed so as to radiate heat toward the transistors MN4 and MN5. The heat radiation fin 53 is formed of the same metal as that of the sense resistor 18. Such a layout leads to an increase in heat radiation from the sense resistor 18 toward the transistors MN4 and MN5. That is, the temperature of the transistors MN4 and MN5 can be made closer to the temperature of the sense resistor 18. Such a layout can also be applied to the circuit shown in FIG. 1.

Figure 8:
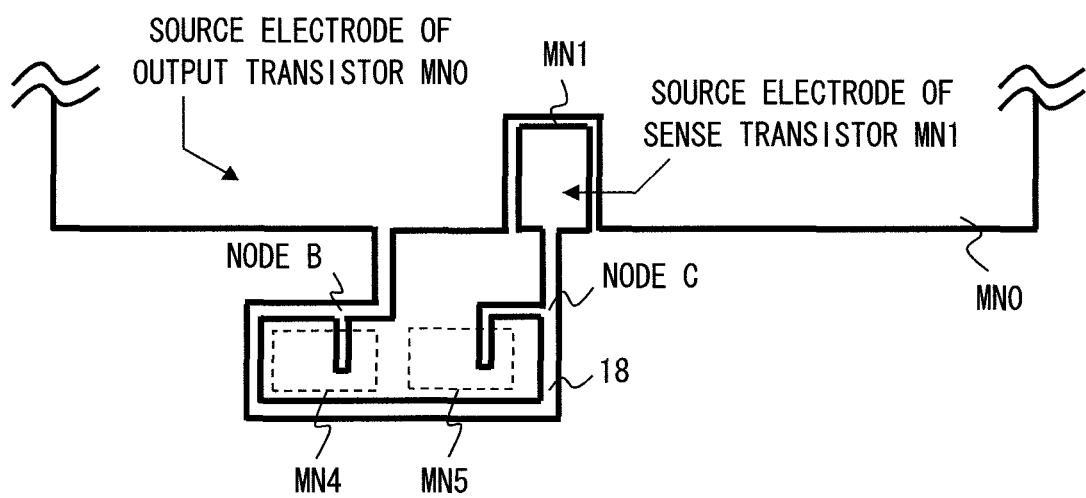
FIG. 8 is a layout diagram showing the current limiting circuit according to the second exemplary embodiment of the present invention.

FIG. 8 is a schematic diagram of FIG. 5 showing a layout approximately to an actual layout. As shown in FIG. 8, the metal resistor used as the sense resistor 18 is formed in the same manufacturing process as that of the metal (e.g., aluminum) forming the source electrodes of the transistors MN0 and MN1. Accordingly, the sense resistor 18 and the source electrodes of the transistors MN0 and MN1 are formed of a single continuous piece of metal. As a result, the temperatures thereof can be made close to each other.

Figure 9:
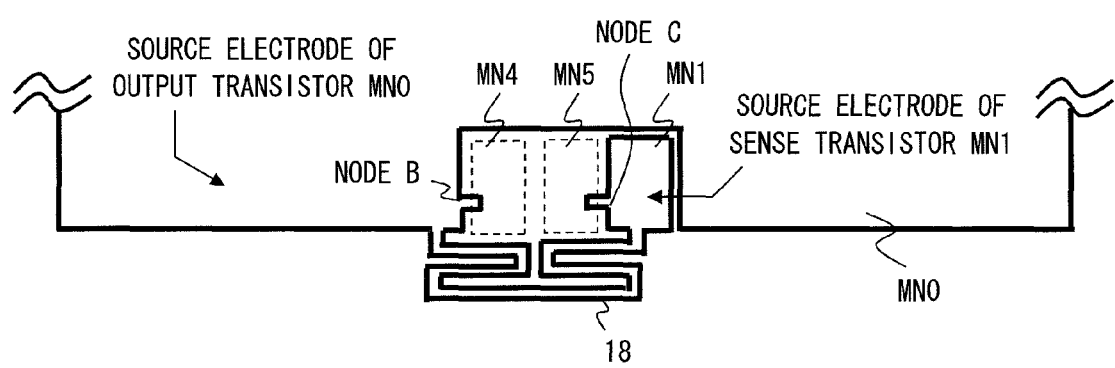
FIG. 9 is a layout diagram showing the current limiting circuit according to the second exemplary embodiment of the present invention.

FIG. 9 is a diagram showing an exemplary layout of the current limiting circuit 101 according to the second exemplary embodiment. As shown in FIG. 9, the transistor MN0 is disposed in an upper part of FIG. 9. On the lower side of the transistor MN0, the transistor MN1 as well as the transistors MN4 and MN5 is disposed in a recess that opens upwardly. The sense resistor 18 that connects the transistor MN0 and the transistor MN1 is disposed so as to close the recess of the transistor MN0 in the region of the determination circuit 31. Thus, the transistors MN4 and MN5 are greatly affected by the heat radiated from the output transistor MN0. Further, the sense resistor 18, which has a high heat conductivity, is also greatly affected by the heat radiated from the output transistor MN0.

Accordingly, in the current limiting circuit 101 according to the second exemplary embodiment, the temperatures of the sense resistor 18, the transistors MN4 and MN5, and the transistors MN0 and MN1 are made approximately equal to each other. This enables the current limiting circuit 101 to accurately control the current flowing through the transistor MN0.

As described above, in the current limiting circuits according to the above exemplary embodiments, the sense resistor 18 is disposed near the elements for temperature correction (potential difference detection unit). Thus, in the current limiting circuits according to the above exemplary embodiments, the temperature of the elements and the temperature of the sense resistor 18 can be made approximately equal to each other. In particular, in the current limiting circuits according to the above exemplary embodiments, the sense resistor 18 is disposed so as to surround the elements for temperature compensation. Hence, in the current limiting circuits according to the above exemplary embodiments, the temperature of the elements and the temperature of the sense resistor 18 can be made much closer to each other. Consequently, the current limiting circuits according to the above exemplary embodiments can suppress the variation in the output current limiting value even when the resistance component of the sense resistor 18 varies due to a temperature change. In short, the current limiting circuits according to the above exemplary embodiments can accurately control the current flowing through the output transistor even when the resistance component of the sense resistor 18 varies due to a temperature change.

Figure 10:
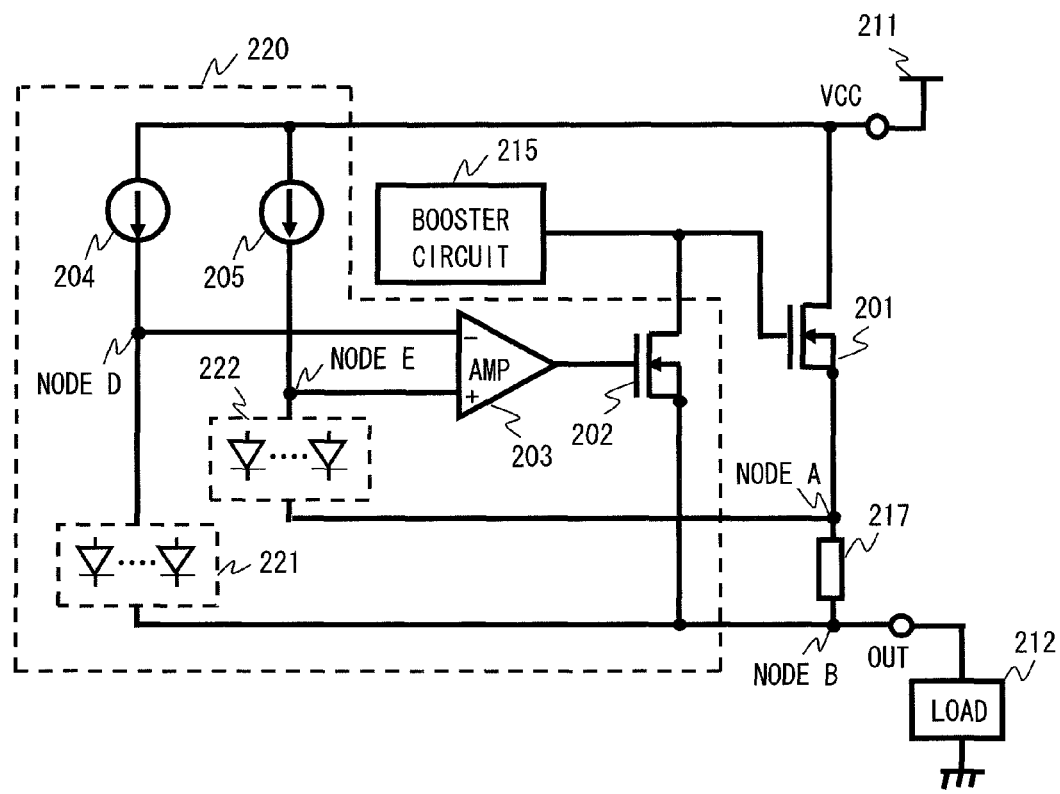
FIG. 10 is a diagram showing a current limiting circuit of a related art.
Figure 11:
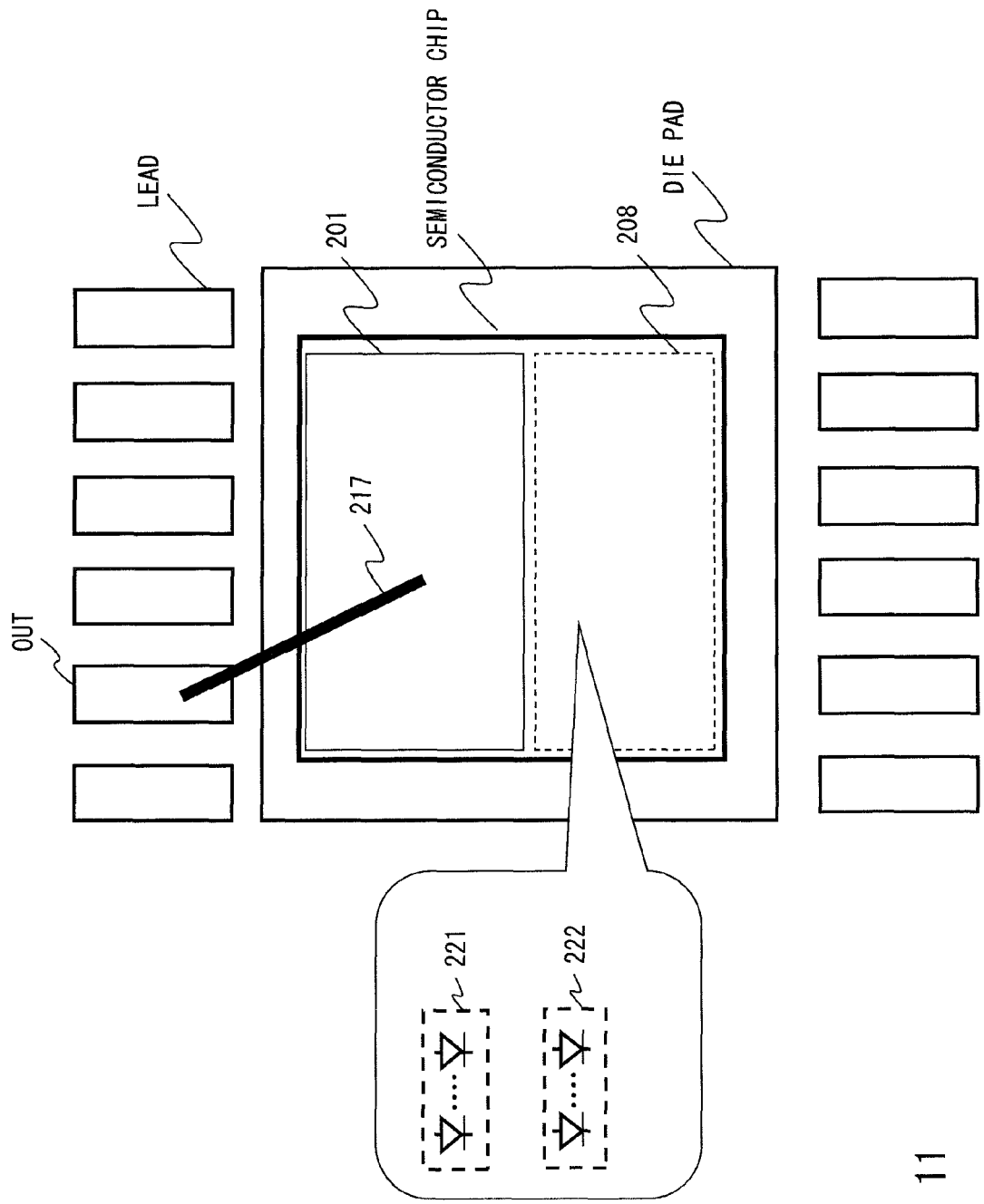
FIG. 11 is a block diagram showing the current limiting circuit of the related art.
Figure 12:
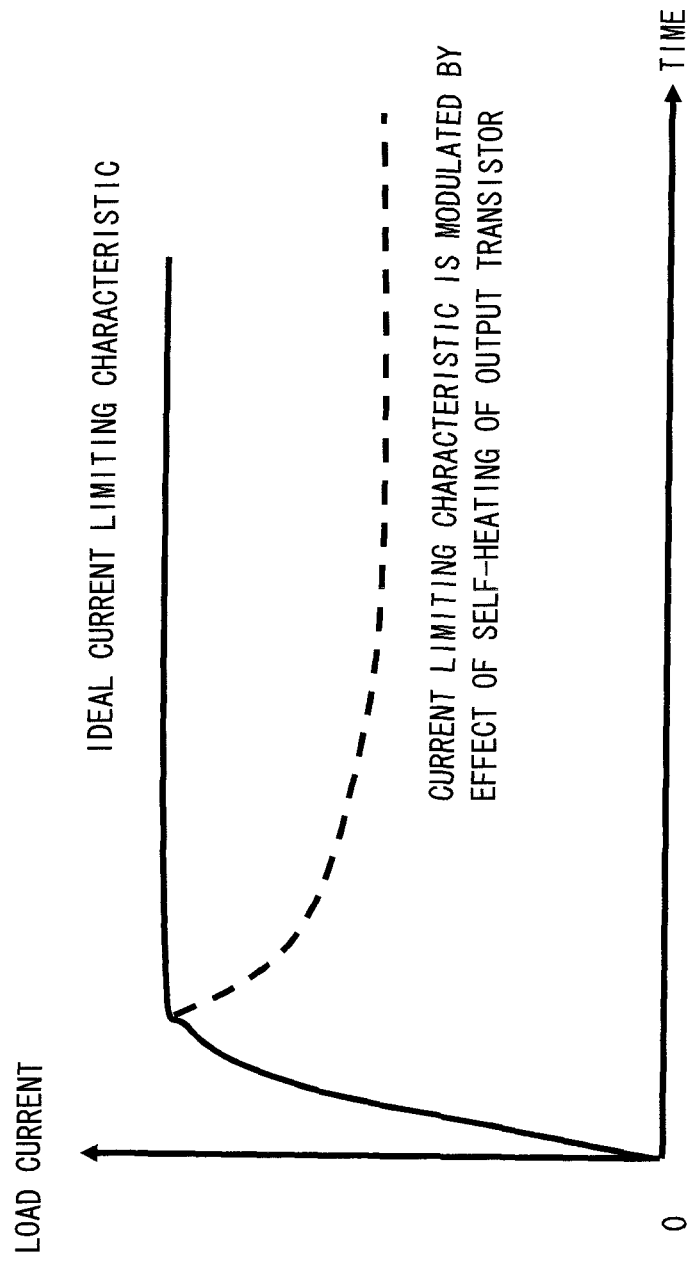
FIG. 12 is a diagram showing characteristics of a current limiting circuit.

Japanese Unexamined Patent Application Publication No. 10-256541 discloses a load driving circuit as a related art (see FIG. 1 of Japanese Unexamined Patent Application Publication No. 10-256541). The load driving circuit disclosed in Japanese Unexamined Patent Application Publication No. 10-256541 includes a main LDMOS (output transistor) 2, a sense LDMOS (sense resistor) 3 provided in parallel with the main LDMOS 2, and a sense resistor 4 connected in series with the sense LDMOS 3, and detects a load current based on a potential generated by the sense resistor 4. The sense resistor 4 is disposed between the main LDMOS 2 and the sense LDMOS 3 (see FIG. 10 of Japanese Unexamined Patent Application Publication No. 10-256541). It is also disclosed that a CrSi thin-film resistor may also be used as the sense resistor 4. Meanwhile, unlike the case of Japanese Unexamined Patent Application Publication No. 10-256541, the current limiting circuits according to the above exemplary embodiments have a feature that the sense resistor 18 and the potential difference detection unit that detects a potential difference generated between the both ends of the sense resistor 18 are disposed to be close to each other. Furthermore, in the current limiting circuits according to the above exemplary embodiments, the sense resistor 18 is disposed so as to surround the potential difference detection unit, resulting in an increase of heat radiated from the sense resistor 18 toward the potential difference detection unit. That is, the temperature of the sense resistor 18 can be made much closer to the temperature of the potential difference detection unit.

The present invention is not limited to the above exemplary embodiments, but may be modified in various manners without departing from the scope of the present invention. The above exemplary embodiments exemplify the case where the load 12 is connected between the output terminal OUT and the low-potential-side power supply terminal GND and the transistor MN0 is used as a high side switch. However, the present invention is not limited thereto. The present invention is also applicable to a circuit configuration in which the transistor MN0 is used as a low side switch. In this case, the output terminal OUT and the low-potential-side power supply terminal GND are directly connected to each other. Further, the load 12 is provided between the high-potential-side power supply terminal VCC and the high-potential-side power supply terminal 11.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A power supply control unit comprising:
    an output transistor formed on a semiconductor chip, the output transistor controlling a current flowing to a load from a power supply;
    a sense transistor and a metal resistor coupled in series with each other forming a combination circuit, the sense transistor and the metal resistor being formed on the semiconductor chip and the combination circuit being coupled in parallel with the output transistor, a current dependent on a current flowing through the output transistor being flowed through the sense transistor and the metal resistor;
    a potential difference detection unit detecting a potential difference generated across the metal resistor, the potential difference detection unit being substantially surrounded by the metal resistor; and
    a control unit controlling a conduction state of the output transistor based on the potential difference.

2. The power supply control unit according to claim 1, further comprising: a current generation unit supplying a current to the potential difference detection unit, a control voltage being generated based on the potential difference and the constant current, a conduction state of the output transistor being controlled based on the control voltage.

3. The power supply control unit according to claim 1, wherein the metal resistor is formed of aluminum, copper, or an alloy containing at least one of these elements as a main component.

4. The power supply control unit according to claim 1, wherein the metal resistor is formed in a zig-zag manner or a serpentine manner so that a convex portion and a concave portion with respect to the potential difference detection unit are continuously formed.

5. The power supply control unit according to claim 1, wherein the metal resistor is integrally formed with a heat radiation fin.

6. The power supply control unit according to claim 1, wherein the metal resistor and the potential difference detection unit are disposed near the output transistor.

7. The power supply control unit according to claim 1, wherein the current generation unit includes first and second current sources, and the potential difference detection unit includes:
    a first diode group provided between the first current source and a node between the sense transistor and the metal resistor; and
    a second diode group provided between the second current source and a node between the metal resistor and the output transistor.

8. The power supply control unit according to claim 7, wherein the control unit includes:
- an amplifier generating the control voltage; and
- a control transistor provided between a control node and a source node of the output transistor, a conduction state of the control transistor being controlled based on the control voltage.

9. The power supply control unit according to claim 1, wherein the current generation unit includes first and second current source transistors, and the potential difference detection unit includes:
- a first transistor provided between the first current source transistor and a node between the sense transistor and the metal resistor; and
- a second transistor provided between the second current source transistor and a node between the metal resistor and the output transistor, control nodes of the first and second transistor being mutually coupled.

10. The power supply control unit according to claim 9, wherein the control unit includes a control transistor provided between a control node and a source node of the output transistor, a conduction state of the control transistor being controlled based on an output voltage of the potential difference detection unit.

11. The power supply control unit according to claim 3, wherein a source node of the output transistor and a source node of the sense transistor comprises a same material as the metal resistor.

* * * * *

UNITED STATES PATENT AND TRADEMARK OFFICE
CERTIFICATE OF CORRECTION

Page 1 of 1

PATENT NO.         : 8,879,227 B2
APPLICATION NO.    : 13/923017
DATED              : November 4, 2014
INVENTOR(S)        : Akihiro Nakahara It is certified that error appears in the above-identified patent and that said Letters Patent is hereby corrected as shown below:

In the Specification

Column 4, Line 55: delete "12," and insert -- I2, --

Column 4, Line 58: delete "12," and insert -- I2, --

Column 5, Line 8: delete "12," and insert -- I2, --

Column 5, Line 12: delete "12," and insert -- I2, --

Column 5, Line 13: delete "12," and insert -- I2, --

Column 5, Line 29: delete "12," and insert -- I2, --

Column 8, Line 34: delete "12," and insert -- I2, --

In the Claims

Column 13, Line 27: In Claim 11, delete "comprises" and insert -- each comprise --

Signed and Sealed this
Twenty-ninth Day of September, 2015

Michelle K. Lee
*Director of the United States Patent and Trademark Office*